… …

United States Patent [19]

Kasahara

[11] Patent Number: 5,618,754
[45] Date of Patent: Apr. 8, 1997

[54] METHOD OF FABRICATING A SEMICONDUCTOR DEVICE HAVING AN AU ELECTRODE

[75] Inventor: Tomokazu Kasahara, Tokyo, Japan

[73] Assignee: NEC Corporation, Tokyo, Japan

[21] Appl. No.: 576,403

[22] Filed: Dec. 21, 1995

[30] Foreign Application Priority Data

Dec. 22, 1994 [JP] Japan .................. 6-335436

[51] Int. Cl.$^6$ ................... H01L 21/44
[52] U.S. Cl. .............. 438/653; 438/720; 438/669
[58] Field of Search ................... 437/190, 192, 437/228 SE, 228 PE, 245; 156/646.1, 656.1

[56] References Cited

U.S. PATENT DOCUMENTS

| | | | |
|---|---|---|---|
| 3,550,260 | 12/1970 | Saltich et al. | 437/192 |
| 4,184,909 | 1/1980 | Chang et al. | 156/643 |
| 4,361,599 | 10/1982 | Wourms | 437/190 |
| 5,240,554 | 8/1993 | Hori et al. . | |
| 5,310,695 | 5/1994 | Suzuki | 437/192 |
| 5,453,156 | 9/1995 | Cher et al. | 156/646.1 |

FOREIGN PATENT DOCUMENTS

| | | |
|---|---|---|
| 62-92323 | 4/1987 | Japan . |
| 2-84734 | 3/1990 | Japan . |
| 5-47761 | 2/1993 | Japan .................. 437/190 |
| 6-120413 | 4/1994 | Japan .................. 437/190 |

Primary Examiner—Jey Tsai
Assistant Examiner—Kevin F. Turner
Attorney, Agent, or Firm—Sughrue, Mion, Zinn, Macpeak & Seas

[57] ABSTRACT

A semiconductor device having an Au electrode is fabricated as follows. As a first step, an insulating film is formed on a semiconductor substrate. As a second step, a contact hole is selectively formed in the insulating film to expose a part of the substrate. As a third step, a barrier metal layer is formed on an entire surface of a resultant structure to bury at least a part of the contact hole and form a barrier metal layer on the insulating film. As a fourth step, an Au layer is selectively formed on the barrier metal layer. As a fifth step, reactive dry etching is performed using the Au layer as a mask and using an etching gas, obtained by adding an $O_2$ gas to a mixed gas of at least one type of chlorine based gas selected from a group of a chlorine gas and a carbon chloride gas, and at least one type of fluorine based gas selected from a group of a carbon fluoride gas and a carbon hydrogen fluoride gas in such a manner that a flow rate ratio of ($O_2$):(chlorine based gas):(fluorine based gas) becomes (1):(4 to 24):(1 to 6), thereby the barrier metal layer is etched out.

10 Claims, 3 Drawing Sheets

METHOD OF FABRICATING A SEMICONDUCTOR DEVICE HAVING AN AU ELECTRODE

BACKGROUND OF THE INVENTION

1. Field of the Invention

The present invention relates to a method of fabricating a semiconductor device, and, more particularly, to a method of fabricating a semiconductor device having an Au electrode, which is adapted to a silicon IC, a transistor, a diode and the like.

2. Description of the Related Art

A semiconductor device having an Au electrode generally has a barrier metal layer formed between the Au electrode and a semiconductor layer to prevent the diffusion of Au. The technique for dry etching of a barrier metal layer essentially with a chlorine based gas in the method of fabricating a semiconductor device having an Au electrode is well known (see Japanese Unexamined Patent Publication No. Sho 62-92323).

FIGS. 1A through 1C present step-by-step cross-sectional views showing a conventional method of fabricating a semiconductor device having an Au electrode. This fabrication method employs the dry etching method disclosed in Japanese Unexamined Patent Publication No. Sho 62-92323 and is adapted to a bipolar transistor as a semiconductor device.

As shown in FIG. 1A, a silicon substrate 1 is prepared. First, a base region 2 is formed in a part of the surface of the silicon substrate 1. A silicon oxide film 8 is formed on the top surface of the silicon substrate 1, and a silicon nitride film 9 is formed on the top surface of the silicon oxide film 8. Then, the silicon oxide film 8 and the silicon nitride film 9 are selectively etched out to form an emitter contact hole 5a. Then, a polysilicon film 4 is so formed as to bury the contact hole 5a, and is subjected to a heat treatment to diffuse the impurity contained in the polysilicon film 4 in the base region 2, thus forming an emitter region 5. Next, a base contact hole 2a is formed in the same manner as the emitter contact hole 5a.

Then, a barrier metal layer 6 is formed by sputtering on the entire top surface of the silicon substrate 1 where the silicon oxide film 8, the silicon nitride film 9 and the like are selectively formed, as shown in FIG. 1B. This barrier metal layer 6 may be formed of a laminated layer, such as a Ti layer-Pt layer or a Ti layer-TiN layer-Pt layer, or a TiW layer or the like. Then, an Au layer is selectively grown by electrolytic plating on the top surface of the barrier metal 6 layer formed in the base contact hole 2a and on the polysilicon film 4, forming an Au electrode 7. With the Au electrode 7 used as a mask, the barrier metal layer 6 is selectively etched off by RIE (Reactive Ion Etching) using, for example, $C_2Cl_2F_4$ as a chlorine based gas. It is taught in Japanese Unexamined Patent Publication No. Sho 62-92323 that $O_2$ may be added to this etching gas.

Consequently, a semiconductor device having an Au electrode is fabricated as shown in FIG. 1C.

A method of fabricating a beam lead type semiconductor device having an Au electrode is disclosed in, for example, Japanese Unexamined Patent Publication No. Hei 2-84734. This beam lead type semiconductor device is fabricated as follows.

First, a Ti—Pt layer is formed on a semiconductor substrate by vapor deposition. Next, a first Au layer to be an electrode is selectively formed by a photoresist method and plating method. Then, a second Au layer which becomes a beam lead is formed by a photoresist method and plating method with the Ti—Pt layer and first Au layer as a conductive path. With the second Au layer used as a mask, the Ti—Pt layer is dry-etched using a chlorine based gas (e.g., $CCl_2F_2$ gas) to which Ar or $O_2$ gas has been added. The back of the substrate is then processed by polishing and a wet resist method.

According to this prior art, the Ar gas is added to the $CCl_2F_2$ gas as the etching gas to reduce the etching rate of Au. To lower the etching rate of Ti as a base film, an $O_2$ gas is added to the $CCl_2F_2$ gas. It is therefore possible to etch the Pt film with a high precision.

Those conventional techniques use a chlorine based gas as the etching gas. Particularly, the use of the $CCl_2F_2$ gas or $C_2Cl_2F_4$ gas for dry etching allows the etching selection ratio of Au to the barrier metal and the etching selection ratio of the barrier metal to the base film to be set relatively larger. Further, the amount of re-adhesion (the amount of deposition) of the etched material on the substrate is small so that the wiring material can be etched with a high precision.

Because $CCl_2F_2$ and $C_2Cl_2F_4$ belong to specified flons, however, they will be discussed to abolish for the future environmental protection. There is therefore a demand for the development of an etching gas which will replace the etching gases using those specified flons.

SUMMARY OF THE INVENTION

Accordingly, it is an object of the present invention to provide a method of fabricating a semiconductor device having an Au electrode using an etching gas containing no specified flon.

It is another object of this invention to provide a method of fabricating a semiconductor device having an Au electrode which can suppress defects originating from an increase in the amount of deposition or short-circuiting, thus improving the production yield and the reliability of semiconductor devices.

To achieve the above object, according to one aspect of this invention, there is provided a method of fabricating a semiconductor device having an Au electrode comprising:

a first step of forming an insulating film on a semiconductor substrate;

a second step of selectively forming a contact hole in the insulating film to expose a part of the substrate;

a third step of forming a barrier metal layer on an entire surface of a resultant structure to bury at least a part of the contact hole and form a barrier metal layer on the insulating film;

a fourth step of selectively forming an Au layer on the barrier metal layer; and a fifth step of performing reactive dry etching using the Au layer as a mask and using an etching gas, obtained by adding an $O_2$ gas to a mixed gas of at least one type of chlorine based gas selected from a group of a chlorine gas and a carbon chloride gas, and at least one type of fluorine based gas selected from a group of a carbon fluoride gas, in which $CCl_2F_2$ and $C_2Cl_2F_4$ gas are included, and a carbon hydrogen fluoride gas, thereby etching said barrier metal layer.

An etching gas may be mixed in such a manner that a flow rate ratio of $O_2$:chlorine based gas:fluorine based gas becomes 1:(4 to 24):(1 to 6).

A conductive layer may selectively be formed on a surface of the semiconductor substrate, and a part of the contact hole may expose the surface of the semiconductor substrate and the conductive layer.

A step of burying the contact hole with a conductive film may be provided between the second step and the third step, whereby the barrier metal layer may be formed on the conductive film.

According to the method of fabricating a semiconductor device having an Au electrode of this invention, because an etching gas obtained by adding the proper amount of $O_2$ gas to a gas mixture of a chlorine based gas and a fluorine based gas is used, the amount of deposition can be reduced by the cleaning performance of the $O_2$ gas. It is also possible to increase the etching selection ratio of Au to the barrier metal and the etching selection ratio of the barrier metal to the base insulating film. This feature can suppress defects originating from an increase in the amount of deposition or short-circuiting, thus improving the production yield and the reliability of semiconductor devices.

DETAILED DESCRIPTION OF THE PREFERRED EMBODIMENT

Figure 1A:
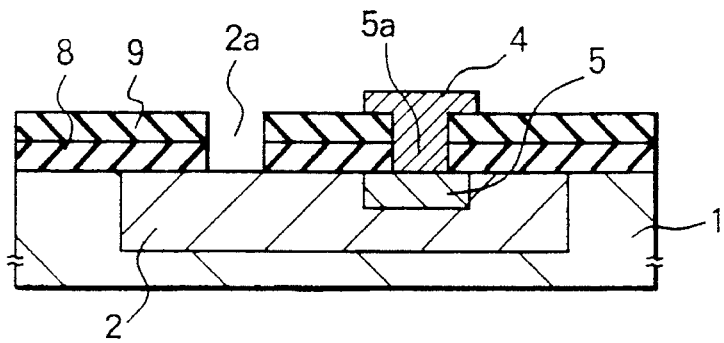
FIGS. 1A through 1C are step-by-step cross-sectional views showing a conventional method of fabricating a semiconductor device having an Au electrode.
Figure 1B:
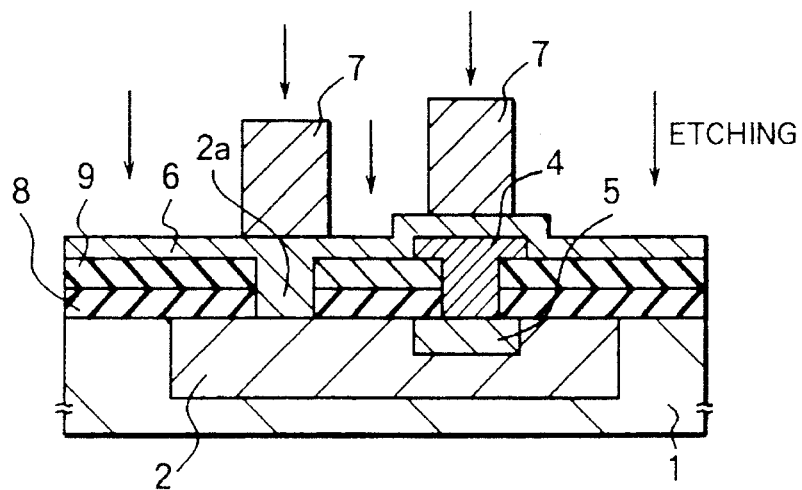
Figure 1C:
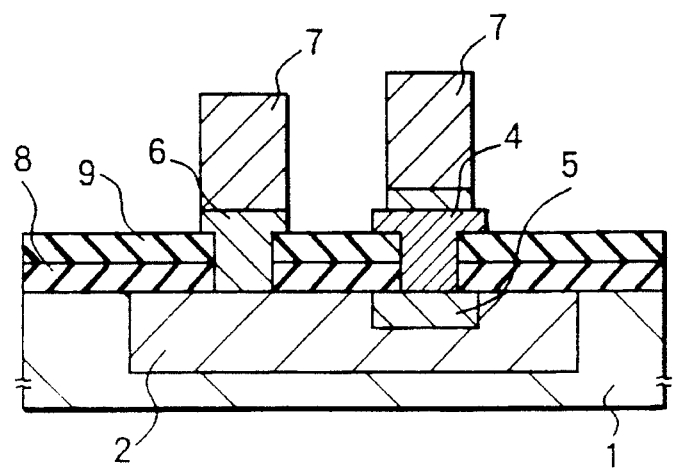

The present inventor conducted various experiments and researches to develop an etching gas capable of etching a wiring material with a high precision, without using any specified flon.

When a gas mixture ($Cl_2+C_3F_8+Ar$) containing $Cl_2$, $C_3F_8$ and Ar is used as an etching gas, for example, the etching rate of the barrier metal becomes slower, thus reducing the etching selection ratio of the barrier metal to the base insulating film, and the amount of deposition is increased. The wiring material cannot therefore be etched with a high precision.

When this gas mixture is used, the increased amount of deposition produces defects. In the inspection of the appearance of products after etching, stains on the surfaces of some semiconductor devices may be detected so that those devices are likely to be rejected as defects. The end portion of the opening to be formed may be covered by the deposition, so that a good pattern may not be formed, which may result in short-circuiting. Hereinafter, defective products produced by the increased amount of deposition will be called "deposition-originated defects."

The decrease in the etching selection ratio of the barrier metal to the base insulating film may disable overetching. Therefore, a good pattern may not be formed, with the result that short-circuiting occurs. Defective products resulting from the short-circuiting that is caused by insufficient etching will be hereinafter called "short-circuiting-originated defects."

Further, as the etching selection ratio of Au to Pt is low, the reduction in the film amount of the Au electrode increases so that the pattern disturbance is likely to occur.

When the $Cl_2+C_3F_8+Ar$ gas mixture is used in place of a specified flon, deposition-originated defects and short-circuiting-originated defects or the like are produced, so that the improvement on the production yield cannot be expected.

The $O_2$ gas is generally used in ashing or the like of resists, and is popular as a surface cleaning gas. In this respect, the present inventor tried to perform reactive ion etching of the barrier metal using an etching gas obtained by adding the $O_2$ gas to the gas mixture of a chlorine based gas and a fluorine based gas. As a result, the etching rate of the barrier metal layer (e.g., Ti layer) dropped as in the case where the $Cl_2+C_3F_8+Ar$ gas was used. Conventionally, therefore, a gas obtained by adding the $O_2$ gas to the gas mixture of a chlorine based gas and a fluorine based gas was not used as a reactive etching gas.

The present inventor however found that if the amount of the $O_2$ gas added to the gas mixture of a chlorine based gas and a fluorine based gas exclusive of $CCl_2F_2$ and $C_2Cl_2F_4$ gas is controlled within a predetermined range, the etching selection ratio of the barrier metal layer (Ti layer-Pt layer, or the like) to Au and the etching selection ratio of the barrier metal layer to the base insulating film (silicon nitride film or silicon oxide film) can be increased while cleaning the surface of the wires or the films to be wires, namely, while preventing the deposition-originated defects. The increased etching selection ratio can prevent the short-circuiting-originated defects and the pattern disturbance, so that highly reliable semiconductor devices can be produced.

A preferred embodiment of this invention will now be specifically described with reference to the accompanying drawings.

Figure 2A:
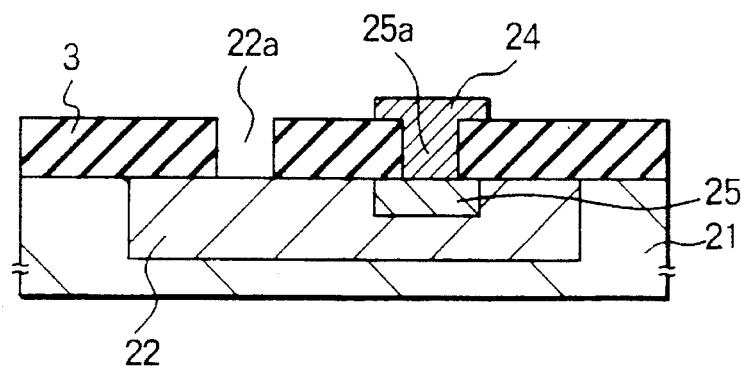
FIGS. 2A through 2C are step-by-step cross-sectional views exemplifying a method of fabricating a semiconductor device having an Au electrode according to the present invention.
Figure 2B:
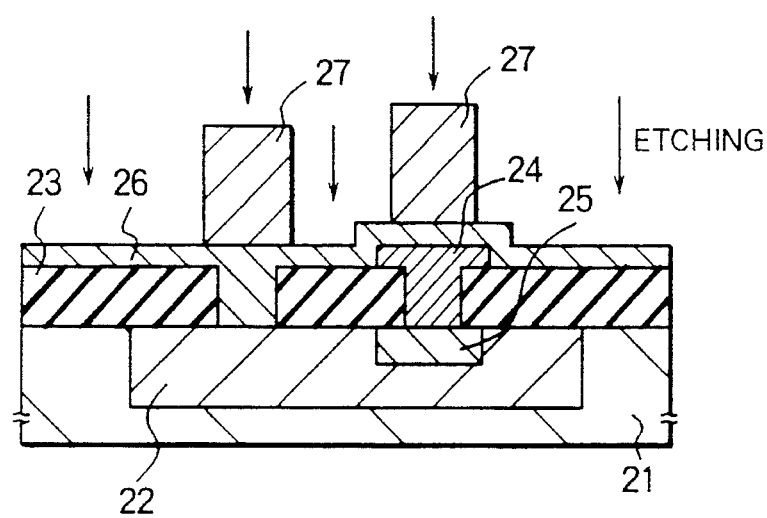
Figure 2C:
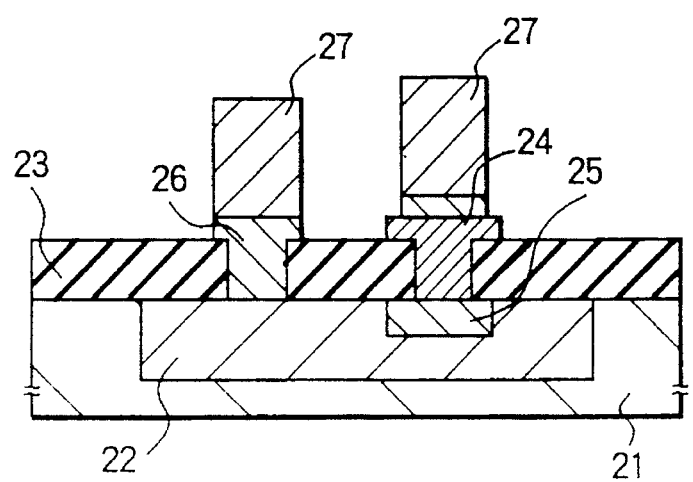

FIGS. 2A through 2C are step-by-step cross-sectional views which exemplify a method of fabricating a semiconductor device having an Au electrode according to this embodiment of this invention. As shown in FIG. 2A, first, a base region 22 is formed in a part of the surface of a silicon substrate 21 by ion injection or the like. Next, a silicon oxide film (having a thickness of 1000 angstroms, for example) and a silicon nitride film (having a thickness of 1000 angstroms, for example) are deposited on the top surface of the silicon substrate 21 by CVD (Chemical Vapor Deposition), forming an insulating film 23. Then, the insulating film 23 is selectively etched by photolithography and dry etching to form an emitter contact hole 25a. Then, a polysilicon film 24 containing an impurity is formed in this emitter contact hole 25a and the resultant structure is subjected to a heat treatment to diffuse the impurity in the polysilicon film 24 into the base region 22 at the surface of the silicon substrate 21, thus forming an emitter region 25. A base contact hole 22a is formed in the same method as employed to form the emitter contact hole 25a.

Then, a Ti film (having a thickness of 1000 angstroms, for example) and a Pt film (having a thickness of 1000 angstroms, for example) are deposited by sputtering to form a barrier metal layer 26, as shown in FIG. 2B. Instead of sputtering, CVD, ion plating or the like may also be used to form this barrier metal layer 26. Further, a part of the barrier metal layer 26 may be formed by plating. Next, a photoresist film (not shown) having an opening at the desired position is formed by a photoresist technique, and with this photoresist film used as a mask, an Au electrode 27 (having a thickness of 10000 Å, for example) is formed by electrolytic plating. Before the formation of the photoresist film, electroless plating may be performed to form a thin Au layer. After the formation of the Au electrode 27, the photoresist film that has been used as a mask is removed.

With the Au electrode 27 used as a mask, a gas mixture of $Cl_2$, $C_3F_8$ and $O_2$ is used as a reactive gas to etch out the exposed barrier metal layer 26, as shown in FIG. 2C. Through those steps, a semiconductor device having an Au electrode is fabricated.

In this embodiment, a parallel plate reactive ion etching system was used as an reactive ion etching system, the operation pressure was 5 mTorr, and the flow rate ratio of the etching gas was set to $O_2:Cl_2:C_3F_8=1:9.6:2.4$. This reactive ion etching system may be a magnetron ion etching device or an etching device which uses a helicon wave.

The flow rate ratio of the etching gas and the etching rates of Au, a typical barrier metal layer and a typical base insulating film used in this embodiment are given in Table 1 below. For the comparative purpose, the etching rates when etching was performed with the same gas flow rate ratio as that of this embodiment but using an Ar gas instead of the $O_2$ gas are shown in Table 1 as a comparative example.

TABLE 1

| | Gas Flow Rate Ratio $O_2$ or $Ar:Cl_2:C_3F_8$ | Power | Etching Rate (Å/minute) | | | |
|---|---|---|---|---|---|---|
| | | | Au | Pt | Ti | SiN |
| Embodiment | ($O_2$) 1:9.6:2.4 | 630 W | 570 | 350 | 2200 | 1300 |
| Comparative example | (Ar) 1:9.6:2.4 | 630 W | 750 | 300 | 1400 | 1000 |

From the etching rate given in Table 1, the etching selection ratio of the barrier metal to Au and the etching selection ratio of the barrier metal to the base insulating film were computed. The results are shown in Table 2 below.

TABLE 2

| | Etching Selection Ratio | | |
|---|---|---|---|
| | Pt/Au | Ti/Au | Ti/SiN |
| Embodiment | 0.61 | 3.86 | 1.69 |
| Comparative example | 0.40 | 1.87 | 1.40 |

As apparent from those Tables 1 and 2, this embodiment uses an etching gas obtained by adding an $O_2$ gas to the gas mixture of $Cl_2$ and $C_3F_8$. Because the flow rate ratio of the etching gas is set properly, the etching selection ratio of the barrier metal to Au and the etching selection ratio of the barrier metal to the base insulating film are large. It is therefore possible to suppress the short-circuiting-originated defects and the pattern disturbance.

Figure 3:
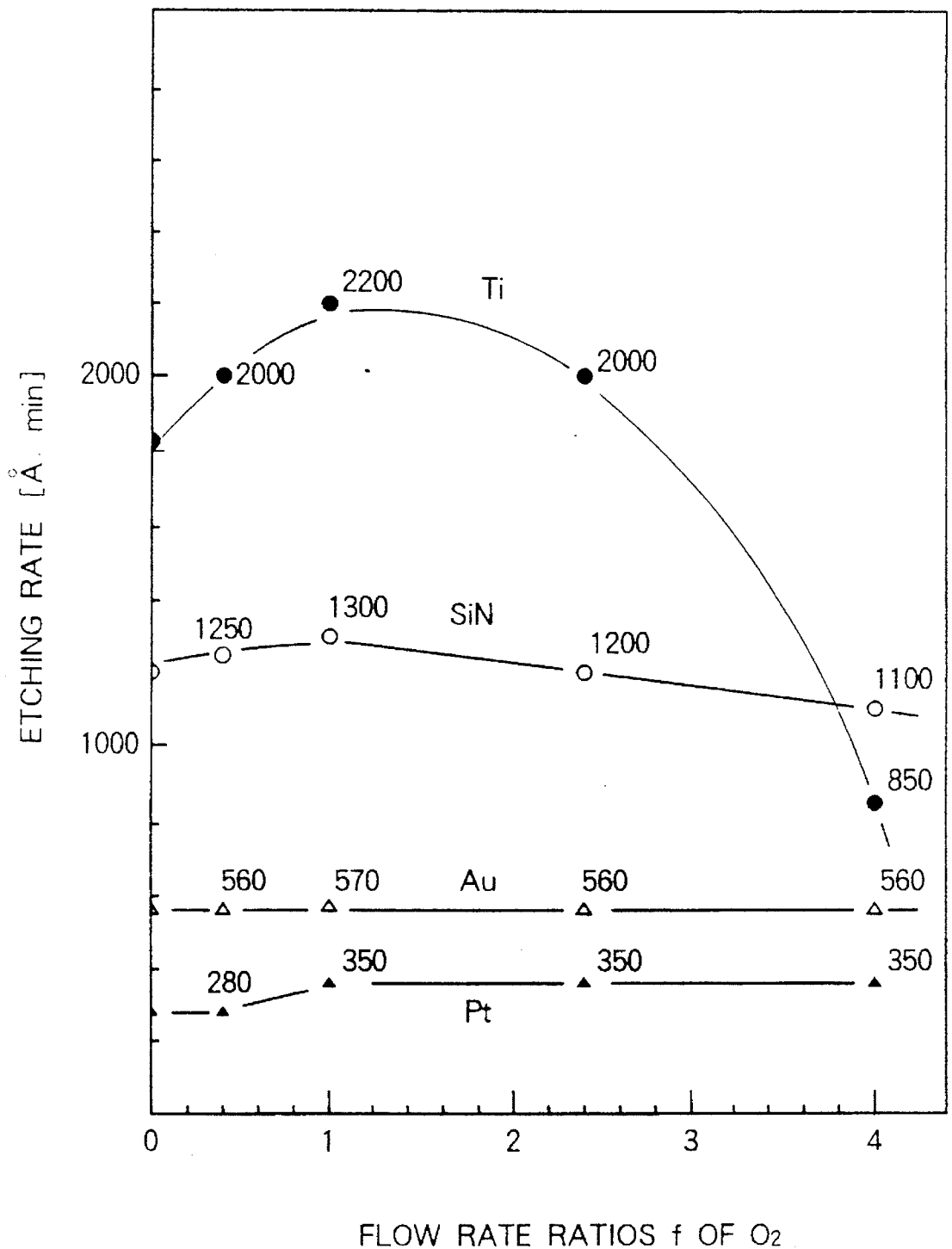
FIG. 3 is a graph showing the etching rates of Ti, SiN, Pt and Au versus the flow rate ratios f of $O_2$ with respect to $Cl_2$ and $C_3F_8$, the etching rates taken on the vertical scale and the flow rate ratios taken on the horizontal scale.

FIG. 3 presents a graph showing the etching rates of Ti, SiN, Pt and Au versus the flow rate ratios f of $O_2$ with respect to $Cl_2$ and $C_3F_8$, the etching rates taken on the vertical scale and the flow rate ratios taken on the horizontal scale. As shown in FIG. 3, if the flow rate ratio f of $O_2$ is within the range from 0 to 2.4, a nearly constant etching rate is obtained for any film material (Ti, SiN, Pt or Au), and a good etching selection ratio is obtainable. As the flow rate ratio f of $O_2$ increases beyond 2.4, the etching rate of Ti drops rapidly. This results in the decrease in the etching selection ratio of Ti to SiN, disabling the high-precision etching of the barrier metal.

When the flow rate ratio f of $O_2$ is 0 or when no $O_2$ is added, the amount of deposition increases. To clarify this point, semiconductor devices were produced by using an $O_2$-added etching gas as an embodiment, a semiconductor device were produced by using an etching gas without $O_2$ as a comparative example and the ratio of defects in each lot was computed. The results are shown in Table 3.

TABLE 3

| | Lot No. | Ratio of Defects (%) |
|---|---|---|
| Embodiment | 1 | 1.9 |
| | 2 | 4.0 |
| | 3 | 2.1 |
| | 4 | 1.1 |
| | 5 | 1.1 |
| Comparative example | 6 | 8.5 |
| | 7 | 7.3 |
| | 8 | 10.1 |

As shown in Table 3, the ratios of defects occurring in the individual lots of a comparative example using an etching gas without $O_2$ range from 7.3 to 10.1%. It is apparent from Table 3 that if the proper amount of $O_2$ is added to the etching gas, the ratios of defects occurring in the individual lots range from 1.1 to 4.0%, significantly lower than those of the comparative example. To attain a good etching selection ratio and prevent deposition-originated defects, therefore, it is necessary to add $O_2$ so that the flow rate ratio of $O_2$ falls within the range from 0.4 to 2.4 with respect to the gas mixture with the ratio of $Cl_2:C_3F_8=9.6:2.4$. The proper range in terms of the flow rate ratios of $Cl_2$ and $C_3F_8$ with the flow rate ratio of $O_2$ taken as "1" becomes $O_2:Cl_2:C_3F_8=1:(4 \text{ to } 24):(1 \text{ to } 6)$. That is, with the amount of added $O_2$ taken as "1," the flow rates of $Cl_2$ and $C_3F_8$ are 4 to 24 and 1 to 6, respectively. If the flow rate ratio falls within this range, therefore, substantially the same etching rate as that of the embodiment shown in Table 1 can be attained.

Although the foregoing description of this embodiment has described a method of fabricating a semiconductor device having a bipolar transistor and using a silicon substrate, as one example of a method of fabricating a semiconductor device having an Au electrode, this invention is not limited to a specific type of semiconductor device. For example, this invention may be adapted to semiconductor devices such as MOS or Bi-MOS devices or a photodiode. As the barrier metal layer, the laminated film of a Ti layer-TiN layer-Pt layer or a TiW layer may be used in place of the laminated film of a Ti layer-Pt layer. This invention may be adapted to a semiconductor device having an Au electrode formed on an interconnection as well as a semiconductor device having an Au electrode formed on a diffusion layer. Further, $CCl_4$ or the like may be used in place of $Cl_2$ as a chlorine based gas in the etching gas. Furthermore, even if $CF_4$, $C_2F_6$ or $CHF_3$ or the like is used in place of $C_3F_8$ as a fluorine based gas in the etching gas, the same advantages as those of the above-described embodiment can be attained.

What is claimed is:

1. A method of fabricating a semiconductor device having an Au electrode comprising:

a first step of forming an insulating film on a semiconductor substrate;

a second step of selectively forming a contact hole in said insulating film to expose a part of said substrate;

a third step of forming a barrier metal layer on an entire surface of a resultant structure to bury at least a part of said contact hole and form a barrier metal layer on said insulating film;

a fourth step of selectively forming an Au layer on said barrier metal layer; and a fifth step of performing reactive dry etching using said Au layer as a mask and using an etching gas, obtained by adding an $O_2$ gas to a mixed gas of at least one type of chlorine based gas and at least one type of fluorine based gas, thereby etching said barrier metal layer;

wherein said at least one type of chlorine based gas is selected from a group of a chlorine gas and a carbon chloride gas, and wherein said at least one type of fluorine base gas is selected from a group of a carbon fluoride gas in which $CCl_2F_2$ and $C_2Cl_2F_4$ gas are not included, and a carbon hydrogen fluoride gas, and wherein said an etching gas is mixed in such a manner that a flow rate ratio of $O_2$:chlorine based gas:fluorine based gas becomes (0.4 to 2.4):9.6:2.4.

2. The method according to claim 1, wherein said barrier metal layer is a layer selected from a group of a laminated layer having a Ti layer and Pt layer, a laminated layer having a Ti layer, a TiN layer and a Pt layer, and a TiW layer.

3. The method according to claim 1, wherein said chlorine based gas is a gas selected from a group of a $Cl_2$ gas and a $CCl_4$ gas.

4. The method according to claim 1, wherein said fluorine based gas is a gas selected from a group of a $C_3F_8$ gas, $CF_4$ gas, $C_2F_6$ gas and a $CHF_3$ gas.

5. The method according to claim 1, wherein a conductive layer is selectively formed on a surface of said semiconductor substrate, and a part of said contact hole exposes said surface of said semiconductor substrate and said conductive layer.

6. The method according to claim 1, further comprising a step of burying said contact hole with a conductive film between said second step and said third step, whereby said barrier metal layer is formed on said conductive film.

7. A method of etching a barrier metal layer on a semiconductor device using an Au electrode as a mask, comprising:

a first step of forming the barrier metal layer on an entire surface of the semiconductor device;

a second step of selectively forming an Au layer on said barrier metal layer; and a third step of performing reactive dry etching using said Au layer as a mask and using an etching gas, obtained by adding an $O_2$ gas to a mixed gas of at least one type of chlorine based gas and at least one type of fluorine based gas, thereby etching said barrier metal layer;

wherein said at least one type of chlorine based gas is selected from a group of a chlorine gas and a carbon chloride gas, and wherein said at least one type of fluorine base gas is selected from a group of a carbon fluoride gas in which $CCl_2F_2$ and $C_2Cl_2F_4$ gas are not included, and a carbon hydrogen fluoride gas, and wherein said an etching gas is mixed in such a manner that a flow rate ratio of $O_2$: chlorine based gas: fluorine based gas becomes (0.4 to 2.4):9.6:2.4.

8. The method according to claim 7 wherein said barrier metal layer is a layer selected from a group of a laminated layer having a Ti layer and Pt layer, a laminated layer having a Ti layer, a TiN layer and a Pt layer, and a TiW layer.

9. The method according to claim 7, wherein said chlorine based gas is a gas selected from a group of a $Cl_2$ gas and a $CCl_4$ gas.

10. The method according to claim 7, wherein said fluorine based gas is a gas selected from a group of a $C_3F_8$ gas, $CF_4$ gas, $C_2F_6$ gas and a $CHF_3$ gas.

* * * * *

UNITED STATES PATENT AND TRADEMARK OFFICE
CERTIFICATE OF CORRECTION

PATENT NO.    : 5,618,754
DATED         : April 8, 1997
INVENTOR(S)   : Tomokazu KASAHARA It is certified that error(s) appears in the above-identified patent and that said Letters Patent is hereby corrected as shown below:

Abstract,   line 18,   delete "(1):(4 to 24):(1 to 6)" and insert -- (0.4 to 2.4):9.6:2.4 --.

Column 2,   line 65,   delete "(1):(4 to 24):(1 to 6)" and insert -- (0.4 to 2.4):9.6:2.4 --.

Column 7,   line 16,   after "group" insert --consisting--;
            line 20,   after "group" insert --consisting--;
            line 23,   after "group" insert --consisting--.

Column 8,   line 23,   after "group" insert --consisting--;
            line 27,   after "group" insert --consisting--;
            line 30,   after "group" insert --consisting--.

Signed and Sealed this

Ninth Day of September, 1997

Attest:

BRUCE LEHMAN

*Attesting Officer*    Commissioner of Patents and Trademarks